United States Patent
Lui et al.

(10) Patent No.: US 7,292,065 B2
(45) Date of Patent: Nov. 6, 2007

(54) ENHANCED PASSGATE STRUCTURES FOR REDUCING LEAKAGE CURRENT

(75) Inventors: Henry Y. Lui, San Jose, CA (US); Malik Kabani, Mountain View, CA (US); Rakesh Patel, Cupertino, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/910,891

(22) Filed: Aug. 3, 2004

(65) Prior Publication Data

US 2006/0028240 A1    Feb. 9, 2006

(51) Int. Cl.
*H03K 19/173* (2006.01)

(52) U.S. Cl. .............................. 326/41; 326/38; 326/47

(58) Field of Classification Search .................. 326/41, 326/37–39, 47, 101–102, 44; 327/442, 437, 327/382, 390
See application file for complete search history.

(56) References Cited

U.S. PATENT DOCUMENTS

| | | | |
|---|---|---|---|
| 4,713,557 A | 12/1987 | Carter | |
| 4,821,233 A | 4/1989 | Hsieh | |
| 4,831,596 A | 5/1989 | Tran | |
| 5,119,337 A | 6/1992 | Shimizu et al. | |
| RE34,363 E | 8/1993 | Freeman | |
| 5,291,079 A | 3/1994 | Goetting | |
| 5,541,529 A * | 7/1996 | Mashiko et al. | ............... 326/39 |
| 5,544,097 A * | 8/1996 | McClure et al. | ............ 365/154 |
| 5,574,634 A | 11/1996 | Parlour et al. | |
| 5,706,226 A | 1/1998 | Chan et al. | |
| 5,717,340 A | 2/1998 | Mehrotra et al. | |
| 5,760,605 A * | 6/1998 | Go | ............................... 326/49 |
| 5,783,962 A | 7/1998 | Rieger | |
| 5,821,771 A * | 10/1998 | Patel et al. | .................... 326/38 |
| 5,841,694 A | 11/1998 | Wong | |
| 5,880,620 A | 3/1999 | Gitlin et al. | |
| 5,959,933 A * | 9/1999 | Zheng | .................... 365/230.06 |
| 6,177,831 B1 * | 1/2001 | Yoneda et al. | ............... 327/537 |
| 6,278,290 B1 | 8/2001 | Young | |
| 6,307,420 B1 | 10/2001 | Zhou | |
| 6,366,498 B1 | 4/2002 | Madurawe et al. | |

(Continued)

FOREIGN PATENT DOCUMENTS

WO    2005/013490    10/2005

OTHER PUBLICATIONS

APEX 20K Programmable Logic Device Family, Data Sheet, Mar. 2000, ver. 2.06, Altera Corporation, pp. 1-208.

(Continued)

*Primary Examiner*—Dinh T. Le
(74) *Attorney, Agent, or Firm*—Ropes & Gray LLP

(57) ABSTRACT

Enhanced passgate structures for use in low-voltage systems are presented in which the operational speed of the passgate structures is maximized, while minimizing leakage current when the structure is turned "OFF." In one arrangement, the $V_T$ of the pass-gate structures is increased relative to the $V_T$ of other transistors fabricated according to a particular process dimension. In addition, a passgate activation voltage is applied to the passgate structures such that the passgate activation voltage is higher in voltage than a nominal voltage being supplied to circuitry other than the passgate structures.

24 Claims, 8 Drawing Sheets

U.S. PATENT DOCUMENTS

| | | | |
|---|---|---|---|
| 6,396,325 | B2 | 5/2002 | Goodell |
| 6,504,212 | B1 * | 1/2003 | Allen et al. ................. 257/347 |
| 6,535,034 | B1 | 3/2003 | Wong |
| 6,563,367 | B1 * | 5/2003 | Lee ............................ 327/390 |
| 6,577,514 | B2 * | 6/2003 | Shor et al. .................... 363/59 |
| 6,612,298 | B2 * | 9/2003 | Mendoza-Orozco ......... 124/37 |
| 6,661,253 | B1 * | 12/2003 | Lee et al. ..................... 326/41 |
| 6,876,572 | B2 | 4/2005 | Turner |
| 2003/0053335 | A1 | 3/2003 | Hart et al. |
| 2003/0071681 | A1 | 4/2003 | Fujimori |
| 2003/0097628 | A1 | 5/2003 | Ngo et al. |
| 2005/0039155 | A1 | 2/2005 | New |

OTHER PUBLICATIONS

FLEX 8000 Programmable Logic Device Family, Data Sheet, Jun. 1999, ver. 10.01, Altera Corporation, pp. 349-410.

FLEX 10K Embedded Programmable Logic Family, Data Sheet, Jun. 1999, ver. 4.01, Altera Corporation, pp. 1-137.

XC3000 Series Field Programmable Gate Arrays (XC3000A/L, XC3100A/L), Product Description, Nov. 9, 1998, ver. 3.1, Xilinx, Inc., pp. 7-3 through 7-78.

V. Betz and J. Rose, "FPGA Routing Architecture: Segmentation and Buffering to Optimize Speed and Density," ACM/SIGDA International Symposium on Field Programmable Gate Arrays, Monterey, CA, pp. 59-68, Feb. 1999.

I. Dobbelaere, M. Horowitz and A. El Gamal, "Regenerative Feedback Repeaters for Programmable Interconnections," IEEE Journal of Solid-State Circuits, vol. 30, No. 11, pp. 1246-1253, Nov. 1995.

* cited by examiner

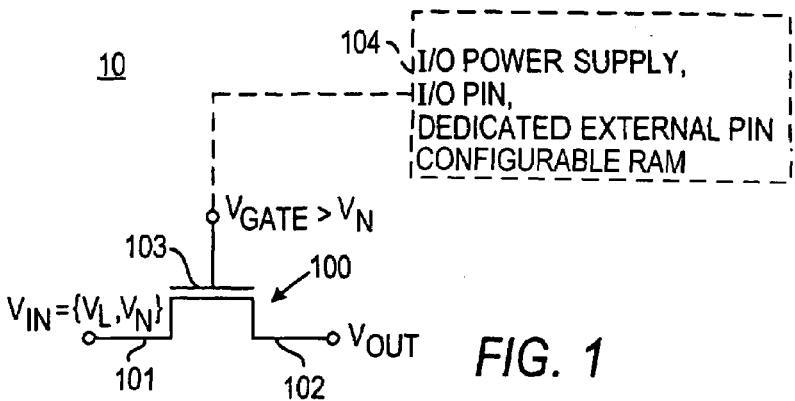
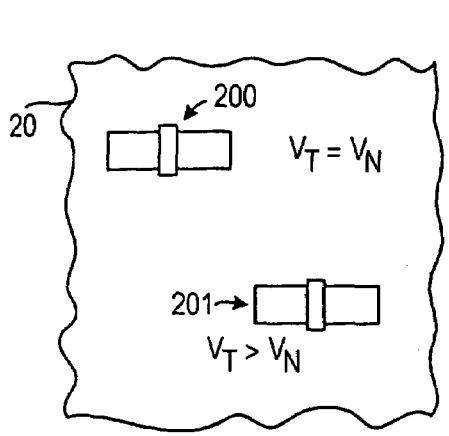
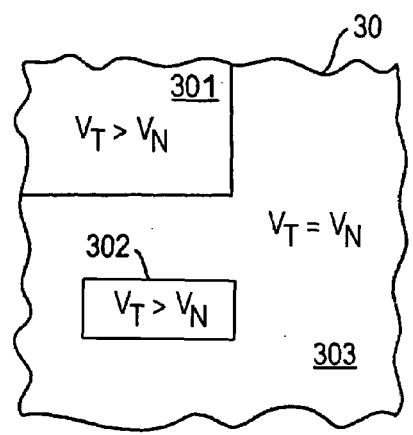
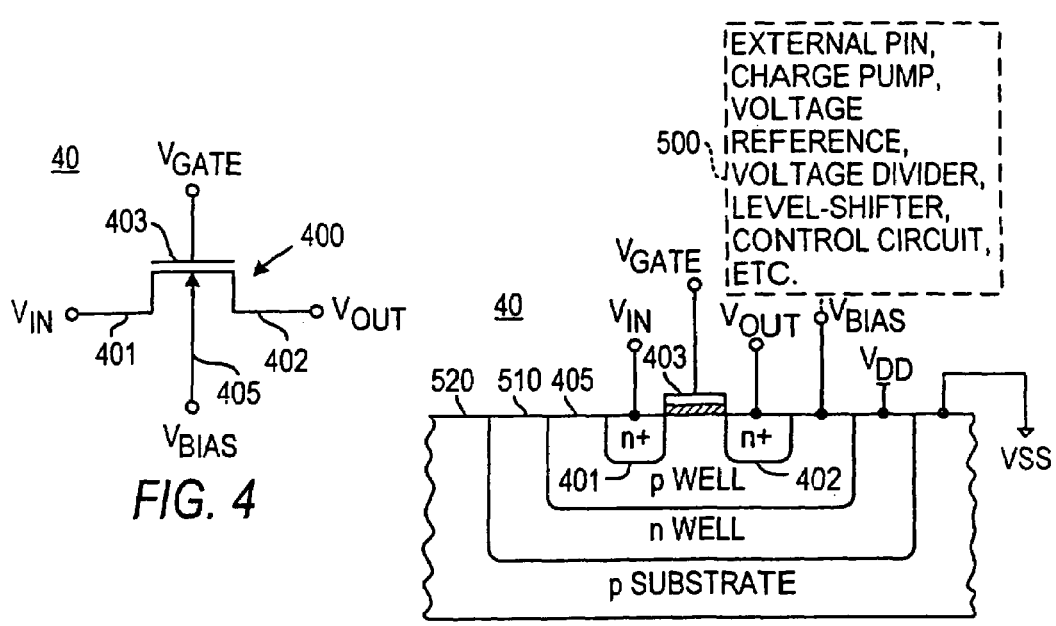

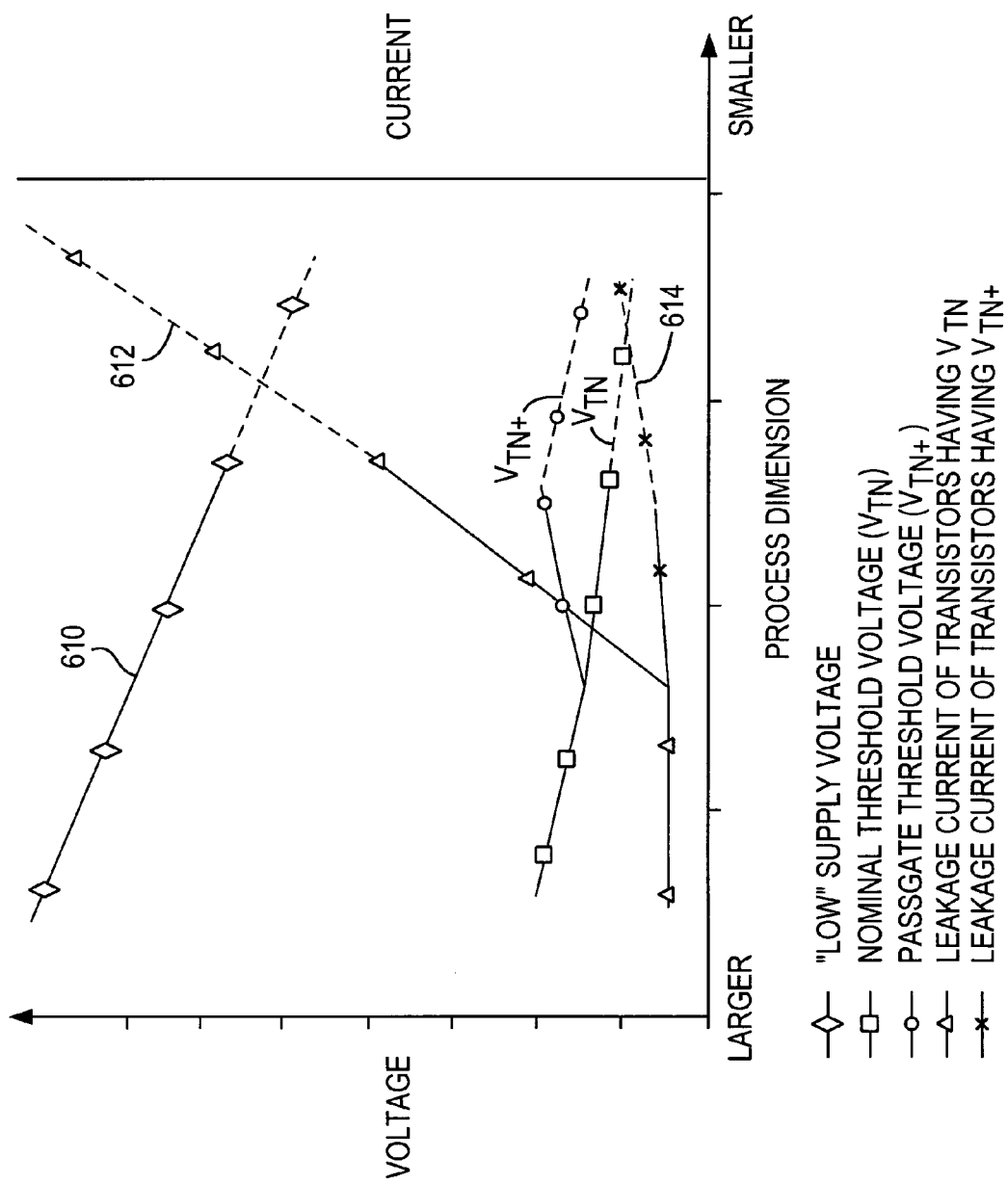

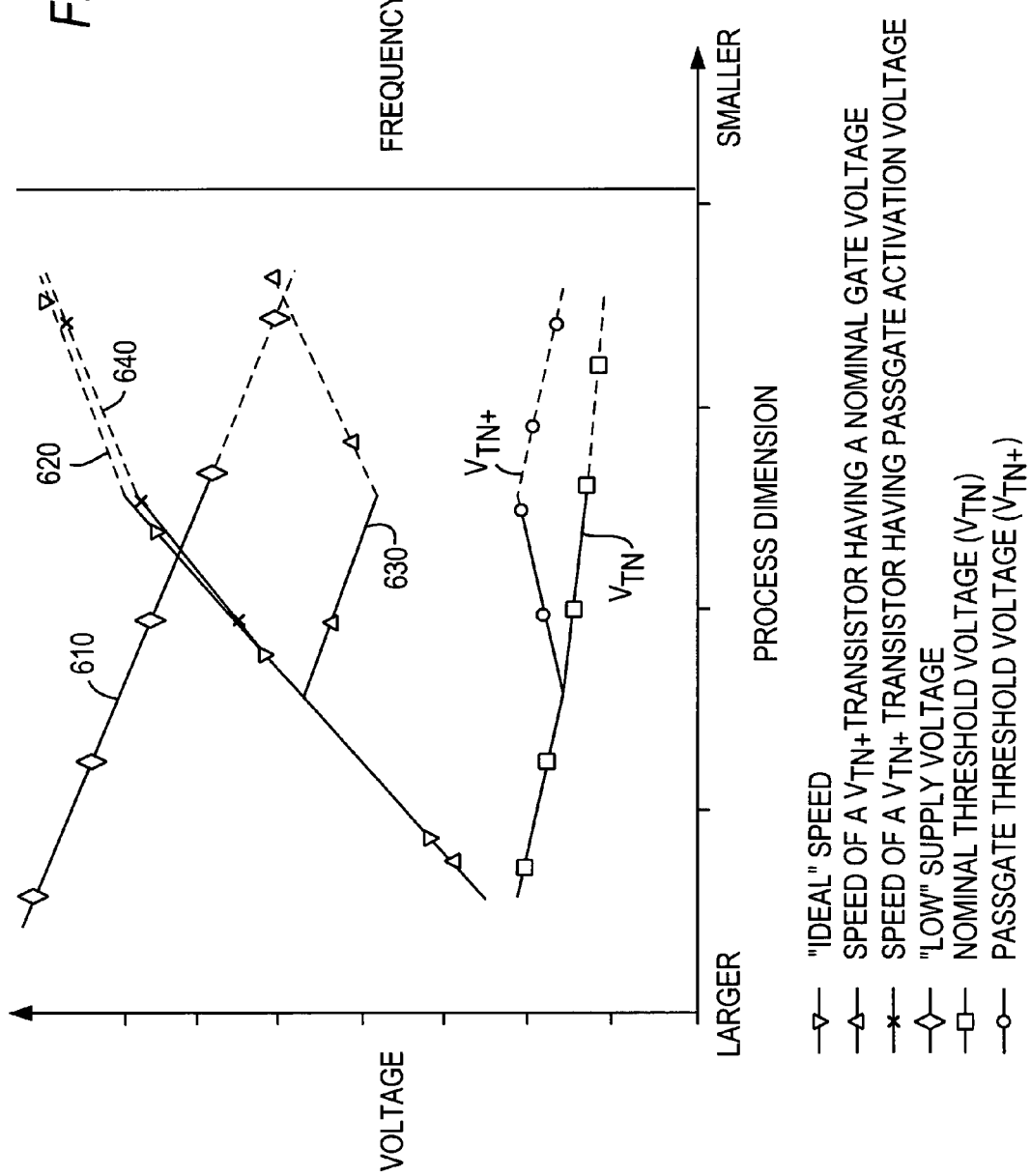

ENHANCED PASSGATE STRUCTURES FOR REDUCING LEAKAGE CURRENT

BACKGROUND OF THE INVENTION

This invention relates to integrated circuit devices, and more particularly to the pass-gate structures that may be used in such devices.

One of the most ubiquitous structures within an integrated circuit device is the single-transistor passgate, which is commonly used to implement (either singly or in combination with other circuits) switches, multiplexers, logic functions (e.g., pass transistor logic), and gating mechanisms for tristatable circuits (e.g., buffers and drivers). In some integrated circuit devices, single-transistor passgate structures may account for a significant portion of the circuitry; for example, in the case of programmable logic devices, single-transistor passgates are used extensively throughout the device as part of the programmable interconnection circuitry.

The operation of a typical single-transistor passgate may be succinctly illustrated by a description of an NMOS passgate (analogous principles of operation, as understood by one skilled in the art, would apply for a PMOS passgate). Depending on whether the potential difference between its gate terminal, $V_{GATE}$, and its source terminal, $V_{SOURCE}$, exceeds the threshold voltage, $V_T$, a NMOS passgate acts as an "open" or a "closed" switch. (As is well-known in the art, there is no physical difference between the "source" and "drain" terminals of a MOS device; the source terminal of a NMOS transistor is the terminal having the lower voltage.) When $V_{GATE}-V_{SOURCE}$ is less than $V_T$, the NMOS passgate is in the "cutoff" state, thereby acting as an "open" switch; when $V_{GATE}-V_{SOURCE}$ is greater than $V_T$, the NMOS passgate is in the conduction state, thereby acting as a "closed" switch.

As is well-known in the art, $V_T$ is not a discrete value for an MOS transistor; it may be considered a range of values that is influenced by a variety of second-order effects, such as substrate bias and subthreshold conduction. However, in order to simplify the illustration of the principles of the present invention, $V_T$ will be discussed herein as if it is a discrete value rather than a range of values.

With the current trend in scaling down device geometries (e.g., 0.18 µm process down to 0.13 µm, 90 nm, and lower) and the consequent use of ever-lower operating voltages (e.g., supply voltages, bias voltages, etc.), which are nearing levels comparable to $V_T$, the ability of transistor passgate structures to function at relatively high speeds while at the same time minimizing leakage current is a difficult design hurdle to overcome.

Moreover, this trend of smaller device geometries and consequent use of lower operating voltages is creating a design tradeoff between speed (e.g., response time for the passgate transistor to turn ON) and leakage current (e.g., the current that passes through the passgate transistor when turned OFF) that was not previously experienced with larger device geometries and the consequent use of higher operating voltages. That is, if conventional design techniques are applied to smaller device geometries, high speed passgate operation is accompanied with high leakage current, whereas low leakage current is accompanied with low speed passgate operation. High leakage current is undesirable because it results in excess heat, power loss, and poorer performance.

Another problem associated with shrinking geometries is the consequent use of lower operating voltages. This lower operating voltage is typically a nominal voltage supplied to the integrated circuitry, and may be insufficient for certain circuitry, such as configurable memory cells (e.g., SRAM) within the integrated circuitry, to operate properly. For example, as the supply voltage decreases, the soft-error-rate increases because the critical charge needed to flip the cells (from one logic state to another) is reduced.

SUMMARY OF THE INVENTION

The present invention relates to enhanced passgate structures for use in low-voltage systems. In accordance with the principles of the present invention, various techniques are presented for reducing leakage current, while at the same time maintaining high speed operation of the pass-gate structures. Although the techniques described herein are illustrated using NMOS passgates, they may be readily adapted to PMOS structures.

In one arrangement, leakage current is reduced and high speed operation is maintained by raising the $V_T$ of the passgate structure above that of the $V_T$ of other structures (e.g., logic transistors) and by applying a passgate activation voltage that is higher than a nominal voltage (e.g., "low" system voltage) to the gate of the passgate structure. An advantage realized by increasing the $V_T$ of the pass-gate structures is that it reduces the leakage current when the passgate structures are turned OFF. The pass-gate activation voltage is sufficient to enable the pass-gate structure to operate at a desired speed even though the $V_T$ has been increased relative to the $V_T$ of other structures other than the passgate structures.

Because the passgate activation voltage is higher than the nominal voltage, the power source providing the activation voltage may be used to power configurable memory cells such as SRAM. Powering the configurable memory cells with a voltage higher than the nominal voltage reduces the soft-error-rate because the higher voltage increases the critical charge needed to flip the cell.

Further features of the invention, its nature and various advantages will be more apparent from the accompanying drawings and the following detailed description of the invention.

BRIEF DESCRIPTION OF THE DRAWINGS

FIG. 1 is a schematic representation of an enhanced passgate structure which may be constructed in accordance with the principles of the present invention.

FIG. 2 is a simplified illustration of an aspect of an integrated circuit device which may be fabricated in accordance with the principles of the present invention.

FIG. 3 is a simplified illustration of an aspect of another integrated circuit device which may be fabricated in accordance with the principles of the present invention.

FIG. 4 is a schematic representation of another enhanced passgate structure which may be fabricated in accordance with the principles of the present invention.

FIG. 5 illustrates an aspect of the enhanced passgate structure of FIG. 4 in greater detail.

FIGS. 6A and 6B are illustrative graphs of different modes of operation of transistors having a nominal $V_T$ and passgate structures having an increased $V_T$ in accordance with the principles of the present invention.

DETAILED DESCRIPTION OF THE INVENTION

Figure 7:
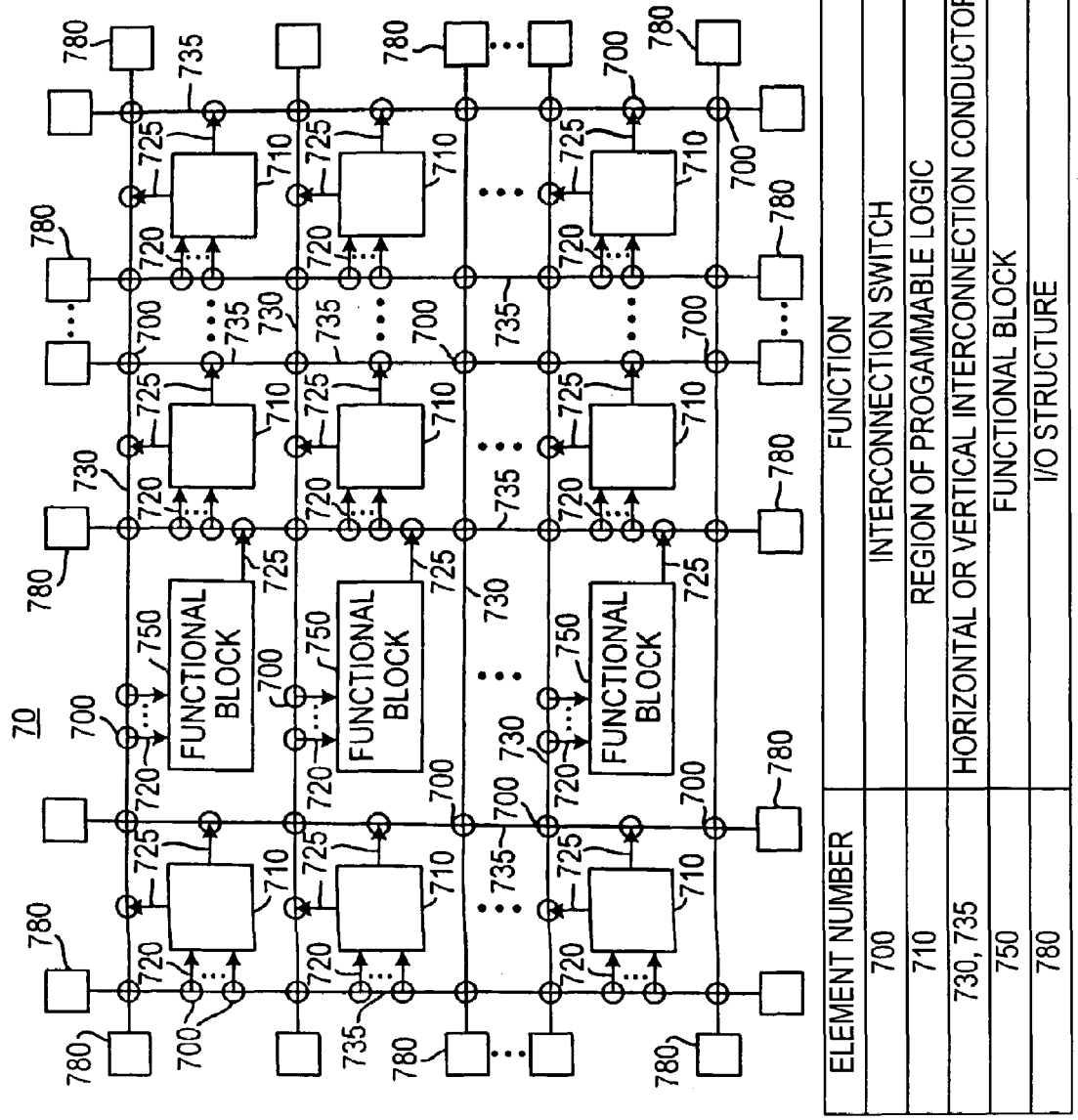
FIG. 7 is a simplified block diagram of a programmable logic device in accordance with the principles of the present invention.

For the purpose of simplifying the discussion of the principles of the present invention, the techniques and embodiments described herein will focus on NMOS pass-gates. However, the principles illustrated herein are applicable to similar arrangements involving PMOS pass-gates.

As defined herein, a nominal voltage is the voltage that is used predominately throughout an integrated circuit, such as a programmable logic device, and is typically associated with "low" voltages. The nominal voltage is sometimes referred to as a system voltage or a core circuitry voltage.

As defined herein, a nominal threshold voltage is the threshold voltage of transistors other than the passgate transistors according to the invention that are included in the integrated circuitry (e.g., programmable logic device). A nominal $V_T$ may be the $V_T$ of a transistor (e.g., a logic transistor) fabricated using a particular process (e.g., a 90 nm process) without attempting to produce a $V_T$ that would not normally be fabricated according to that particular process.

FIG. 1 illustrates one arrangement for reducing leakage current, while maintaining high speed operation of the NMOS passgates in accordance with the principles of the present invention. In the arrangement shown in FIG. 1, the $V_T$ of NMOS passgate 100 is fabricated to have a higher than nominal $V_T$ than other transistors fabricated according to a particular process dimension (e.g., a 90 nm process). The voltage being applied to the gate, $V_{GATE}$, of NMOS passgate 100 is higher than the nominal voltage. $V_{GATE}$ is sometimes referred to herein as the passgate activation voltage. In some designs, depending on the process being used and the voltage difference between VIN and $V_{GATE}$ or the difference between $V_{OUT}$ and $V_{GATE}$, NMOS passgate 100 may be a high-voltage tolerant transistor, such as a thick-oxide device, in order to reliably handle voltage being applied to its gate to prevent, for example, gate-oxide breakdown.

For the purposes of the present invention, $V_{GATE}$ may be a static bias voltage or a dynamic signal. In one embodiment, as illustrated in FIG. 1, the passgate activation voltage may be derived from any of a variety of sources 104, such as a dedicated external pin on which a voltage greater than the nominal voltage is provided, an I/O pin (e.g., control/data signals provided from an external source that provides a voltage higher than a nominal voltage), or a positive I/O supply voltage, $V_{DD\text{-}I/O}$ (e.g., when the core circuitry and the I/O circuitry have separate power supplies and $V_{DD\text{-}I/O}$ is greater than the nominal voltage).

In other embodiments, depending on the application, the passgate activation voltage may also be generated by any of a variety of voltage boosting/conversion circuitry such as charge pumps and voltage converters (e.g., DC/DC, AC/DC, etc.). In yet other embodiments, the passgate activation voltage may be provided by a memory cell such as an SRAM-cell.

It will be understood that the extent to which the passgate activation voltage exceeds the nominal voltage can vary depending on several factors such as type of transistor and gate-oxide thickness. It will further be understood that the pass-gate activation voltage exceeds the nominal voltage by a predetermined voltage. For example, the predetermined percentage may range from about one percent to about two hundred percent, depending on various factors.

The application of this passgate activation voltage to the gates of the passgate structures insures that the desired passgate operation speed is obtained.

As semiconductor processes continue to decrease in size, $V_T$ continues to decrease. As is known in the art, a reduction in $V_T$ results in a corresponding increase in leakage current during the "OFF" state. In accordance with the principles of the present invention, it is thus preferable to increase the threshold voltages of those specific transistors being used as pass-gates.

One arrangement for accomplishing this is shown in FIG. 2, which schematically illustrates a portion of a representative integrated circuit device 20, in which two transistors have been fabricated with different threshold voltages. As shown in FIG. 2, transistor 200 is configured to operate as something other than a passgate structure and may be fabricated with an associated $V_T$ equal to $V_N$ (a nominal $V_T$). The other transistor 201 is configured to operate as a passgate, and may be fabricated with an associated $V_T$ that is higher than $V_N$ by a predetermined percentage.

The above-mentioned predetermined percentage may range from about one percent to about two hundred percent, from about one percent to about one hundred percent, from about one percent to about fifty percent, from about five percent to about forty-five percent, from about ten percent to about forty percent, from about fifteen percent to about thirty-five percent, from about twenty percent to about thirty percent, from about one percent to about thirty percent, from about five percent to about thirty percent, from about ten percent to about thirty percent, from about twenty percent to about forty percent, from about twenty-five percent to about thirty-five percent, or from about thirty percent to about fifty percent.

It will be understood that any increase in threshold voltage over the nominal threshold voltage assists in minimizing leakage current and is in accordance with the principles of the present invention. Thus it is understood that the present invention is not limited to the percentages enumerated herein.

Expanding on the arrangement shown in FIG. 2, FIG. 3 shows a portion of an integrated circuit device 30, which is divided into different sections 301/302/303, wherein all the transistors within a given section have been fabricated with a specific threshold voltage that may be different from that of the transistors in the other sections. For example, sections 301 and 302 may each be a routing network with a high concentration of passgates (which may be used to construct, for example, interconnection switches and multiplexers). Accordingly, the transistors in sections 301 and 302 could be fabricated with a $V_T$ that is higher than that of the transistors in other sections 303.

As an alternative, or in addition, to selectively fabricating low $V_T$ transistors, FIGS. 4 and 5 illustrate an arrangement wherein a higher than nominal $V_T$ may be achieved by controlling the bias voltage, $V_{BIAS}$, of the well 405 in which the NMOS passgate 400 is fabricated. For the purposes of the present invention, NMOS passgate 400 is preferably fabricated in a well 405 which is capable of being biased to a voltage that is different from that which is used to bias the substrate 520. In the illustrative embodiment shown in FIG. 5, for example, a triple-well process may be used to allow p-well 405 to be biased separately from the p-substrate 520, thereby allowing the $V_T$ of NMOS passgate 400 to be adjusted as a function of the source-to-bulk potential difference, $V_{SB}$, which, in the arrangement shown in FIG. 5, is dependent on $V_{BIAS}$. The relationship between $V_T$ and $V_{SB}$ for an NMOS transistor, which should be familiar to those skilled in the art, may be expressed as follows:

$$V_T = V_{t0} + \gamma[sqrt(V_{SB} + 2\Phi_F) - sqrt(2\Phi_F)]$$

(wherein $V_{t0}$ is the threshold voltage when $V_{SB}$ is zero, g is the body-effect constant, and $\Phi_F$ is a term associated with the doping of the well). Accordingly, the $V_T$ of NMOS passgate 400 may thus be increased by creating a positive $V_{SB}$ by setting the bias voltage, $V_{BIAS}$, of well 405 to a level that is lower than the voltage level present on the source terminal of NMOS passgate 400. For the purposes of the present invention, $V_{BIAS}$ should not be too low so as to forward bias the junction between the source/drain 401/402 and the p-well 405.

In accordance with the principles of the present invention, $V_{BIAS}$ may be derived from any of a variety of sources and bias generation schemes 500, which may be either internal or external to the integrated circuit device which includes NMOS passgate 400. Such sources 500 may include external pins, charge pumps, voltage references, voltage dividers, level-shifters, control/feedback circuitry, and the like. In some designs, $V_{BIAS}$ may be provided as a static voltage, which may or may not correspond to any of the supply voltages used on the integrated circuit device. In other designs, it may be preferable to use a dynamic voltage for $V_{BIAS}$, which may be provided by a control circuit that generates a variable $V_{BIAS}$ that may be a function of any of a variety of parameters, such as process variations, temperature, voltage, current, or a combination thereof. As a result, the $V_T$ of NMOS passgate 400 may be tuned in a feedback loop to achieve a high $V_T$ that, when coupled with higher than nominal gate voltages, optimizes, for example, the tradeoff between high speed passgate operation and reducing leakage current.

FIGS. 6A and 6B show graphs comparing performance characteristics of passgate structures constructed according to the invention and to other transistors not being used as passgates, both of which are fabricated according to a given process dimension. Both FIGS. 6A and 6B show an illustrative trend in supply voltages (line 610) for a given process dimension. FIGS. 6A and 6B show an illustrative trend of nominal threshold voltages, $V_{TN}$, of transistors other than the passgate structures according to the invention. FIGS. 6A and 6B also illustratively show a higher than nominal threshold voltages, $V_{TN+}$, of the passgate structures according to the invention. Note that the supply voltage decreases as the process dimension decreases. Further note that $V_{TN}$ decreases as the process dimension decreases, whereas $V_{TN+}$ is higher than $V_{TN}$ by a predetermined percentage for various process dimensions (e.g., process dimensions smaller than 0.13 μm). Yet further note that a portion of the trends shown in FIGS. 6A and 6B have dashed lines. These dashed lines generally represent anticipated values of voltage, leakage current, and frequency that may be obtained in future process dimensions.

Referring now specifically to FIG. 6A, the leakage current (line 612) for a transistor having $V_{TN}$ is compared to the leakage current (line 614) for a passgate transistor having $V_{TN+}$ for a given process. Note that for "larger" processes (e.g., greater than 0.13 μm processes), the threshold voltage of the passgate structures need not be higher than the nominal threshold voltage. Thus, this is why FIGS. 6A and 6B do not show the $V_{TN+}$ "circles" extending to the far left in the figure. As shown, the leakage current is low for transistors fabricated according to "larger" process dimensions and that have a threshold voltage of $V_{TN}$. However, as the process dimension decreases, the leakage current for transistors having $V_{TN}$ rises dramatically, whereas the leakage current for transistors having $V_{TN+}$ remains relatively low (i.e., the leakage current is reduced compared to the leakage current experienced by transistors having a nominal threshold voltage).

Referring now to FIG. 6B, the frequency of transistors having $V_{TN}$ or $V_{TN+}$ and being driven by a nominal voltage or passgate activation voltage are compared. Line 620 represents an "ideal" operational speed attained with transistors having $V_{TN}$ and being driven by a nominal voltage. However, this speed is achieved at the cost of high leakage current, as indicated by line 612 in FIG. 6A. Line 630 represents a speed profile of transistors having $V_{TN+}$, but is driven with a nominal gate voltage. As shown in FIG. 6B, the speed of line 630 is substantially less than ideal at the smaller process dimensions. However, line 640, which represents the speed of pass-gate transistors according to the invention have $V_{TN+}$ and are driven by a passgate activation voltage (e.g., a voltage higher than the nominal voltage), substantially matches the ideal speed of line 620, while at the same time benefits from having a relative low leakage current.

The above-described passgate structures 10/201/40 that may be constructed in accordance with the principles of the present invention are especially useful in integrated circuit devices, such as programmable logic devices, in which such pass-gate structures are used as interconnection switches to allow programmable routing and switching. FIG. 7 is a simplified block diagram of an illustrative programmable logic device 70 in which interconnection switches using passgate structures that have been constructed in accordance with the principles of the present invention may be readily used. Programmable logic device 70 includes a plurality of regions of programmable logic 710 operatively disposed in a two-dimensional array of rows and columns, and a programmable network of horizontal 730 and vertical 735 interconnection conductors for conveying signals amongst the logic regions 710 and various I/O structures 780. In the network of interconnection conductors 730/735, signals may be programmably routed via interconnection switches 700, which, in some designs, may also be grouped to form multiplexers. In some embodiments, programmable logic device 70 may also include any of a variety of functional blocks 750, such as memory structures, multiplier/accumulator blocks, arithmetic logic units, microprocessors, etc. Functional blocks 750 may be dedicated structures that are configured to implement a specific function, or, alternatively, they may be user-programmable/reconfigurable structures.

Figure 8:
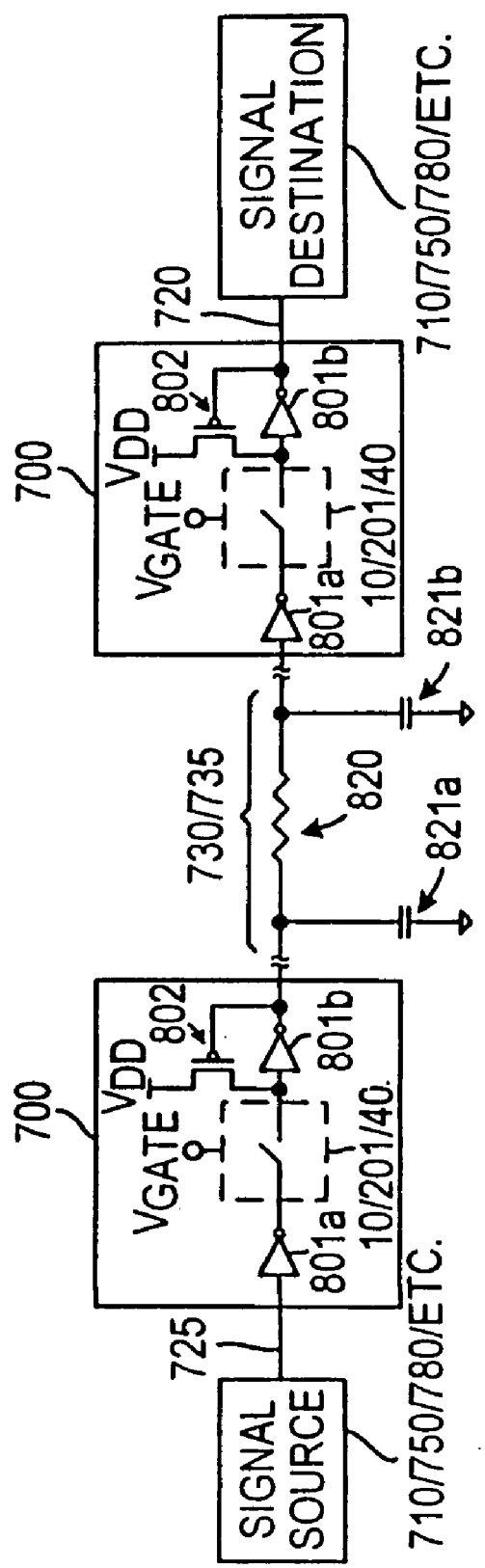
FIG. 8 illustrates how an aspect of the programmable logic device of FIG. 7 may be improved in accordance with the principles of the present invention.

FIG. 8 illustrates in greater detail how interconnection switches 700 may be used in the network of interconnection conductors 730/735 to route signals within programmable logic device 70. For the purpose of illustrating the principles of the present invention, a signal source/destination within programmable logic device 70 may be any of the logic regions 710, functional blocks 750, I/O structures 780, or other circuitry within programmable logic device 70. As schematically illustrated in FIG. 8, a signal may be routed from any given source to any given destination by using interconnection switches 700 to multiplex or switch signals provided on the output leads 725 of signal source 710/750/780/etc. onto the network of interconnection conductors 730/735 (within which interconnection switches 700 may also be used to programmably connect one interconnection conductor to another), from which the signal may be eventually multiplexed or switched onto the input lead 720 of signal destination 710/750/780/etc. As shown in FIG. 8, the electrical characteristics of the network of interconnection conductors 730/735 may be represented as a chain of resistors 820 and capacitors 821a/b in a "black-box" abstraction.

Also shown in FIG. 8 is one embodiment of an interconnection switch 700 that may be constructed using the above-described enhanced passgate structures in accordance with the principles of the present invention. As illustrated in FIG. 8, interconnection switch 700 may include any of the passgates 10/201/40 as the switching mechanism. In some embodiments, a pair of inverters 801a and 801b, along with a "half-latch" PMOS transistor 802, may also be included to provide buffering of the input and output signals. Half-latch PMOS transistor 802 may be used to recover from the voltage drop across the passgate 10/201/40.

Figure 9:
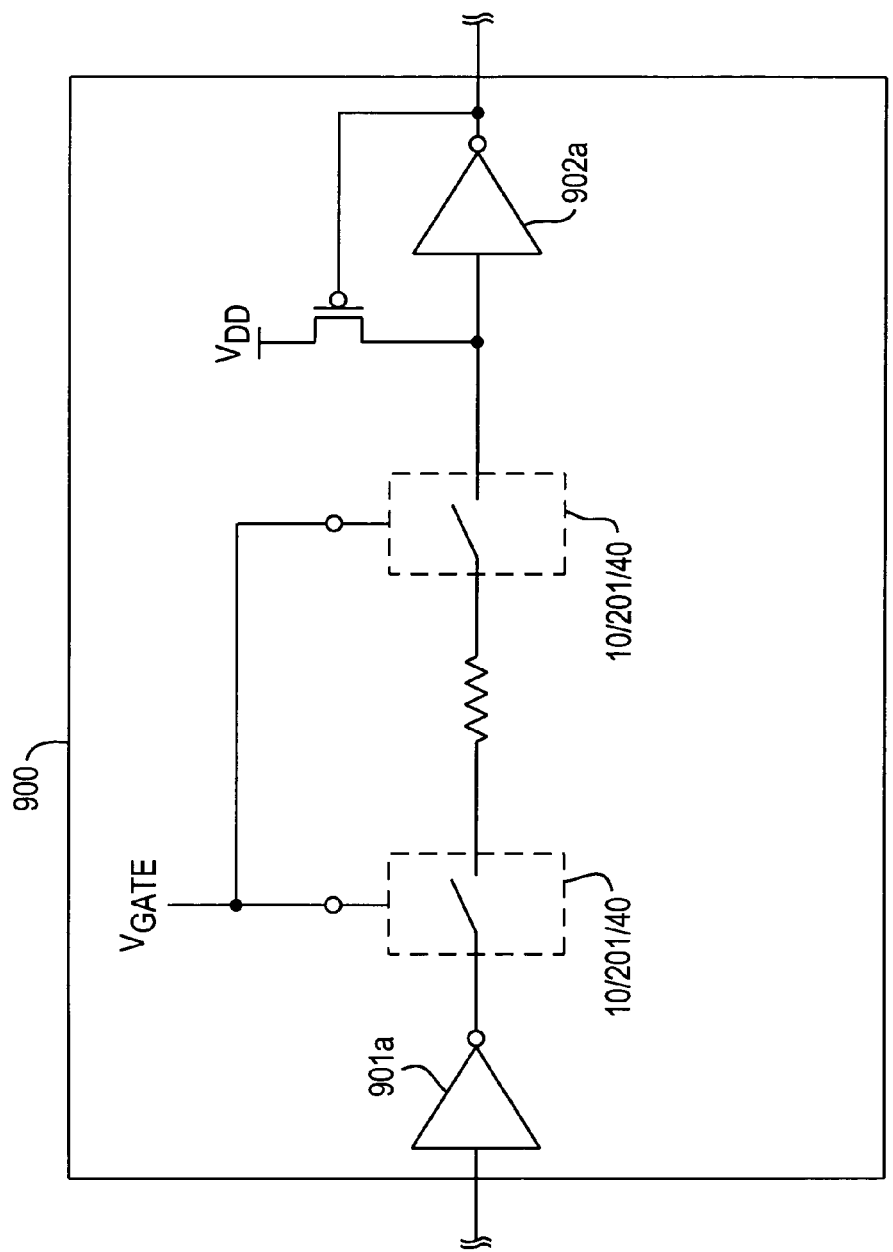
FIG. 9 illustrates another aspect of the programmable logic device of FIG. 7 may be improved in accordance with the principles of the present invention.

FIG. 9 shows another embodiment of an interconnection switch 900 that may be constructed using the above-described enhanced passgate structures in accordance with the principles of the present invention. As illustrated in FIG. 9, interconnection switch 900 may include two of passgates 10/201/40 for use as a dual-passgate switching mechanism. If desired, switch 900 may include inverters 901a and 901b to buffer the input and output signals. Half-latch PMOS transistor 910 may be included to compensate for the voltage drop across the dual-passgate switching mechanism. It is understood that interconnection switch 900 can be used in place or intermixed with interconnection switch 700 in FIG. 7.

Figure 10:
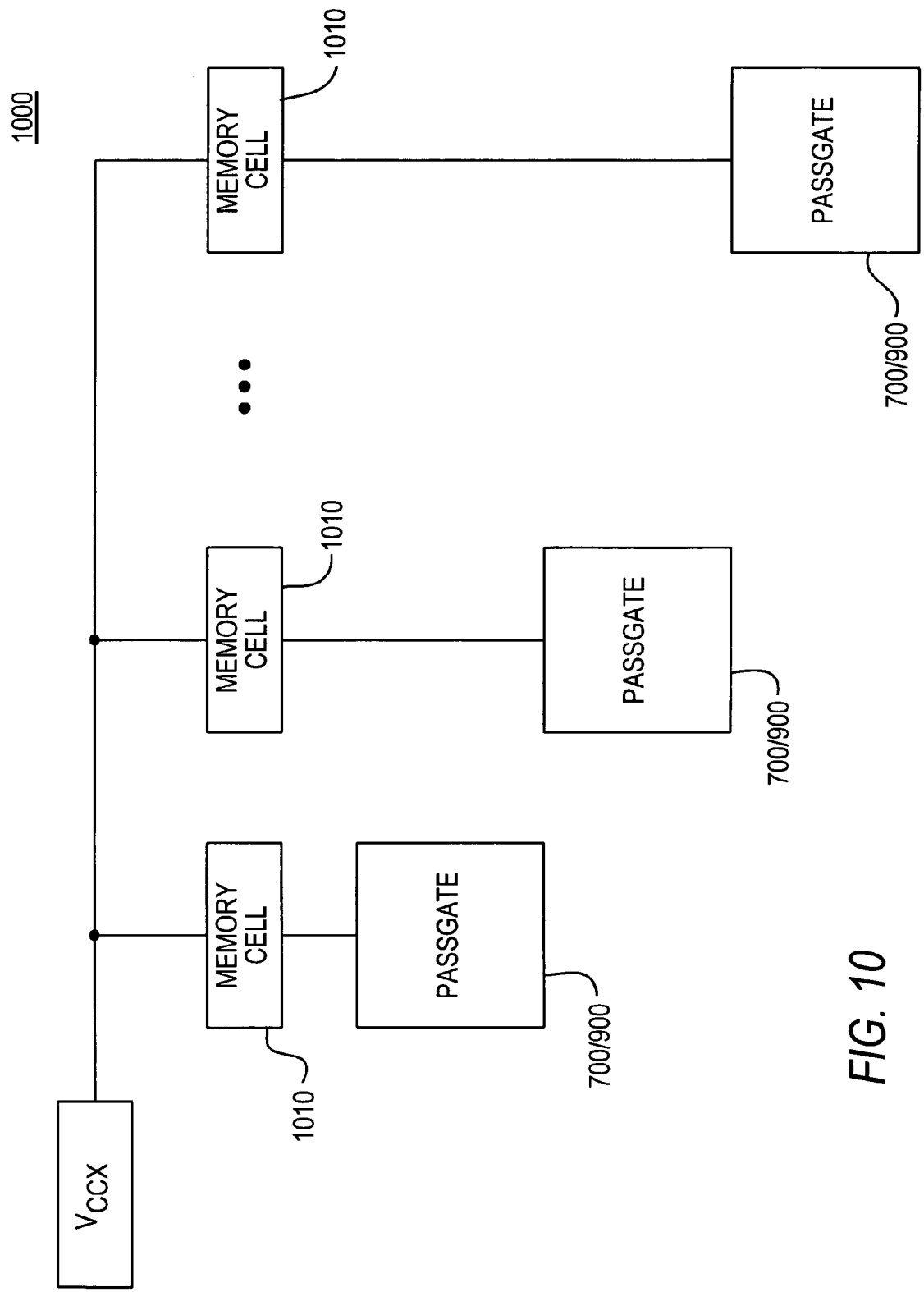
FIG. 10 is a simplified block diagram of configurable memory cells that selectively drive passgate structures in accordance with the principles of the present invention.

FIG. 10 shows a portion of an integrated circuit 1000 employing the use of memory cells 1010 to drive passgate transistors 700/900 according to the principles of the present invention. Memory cells 1010 may be configurable ram cells such as SRAM cells. Passgate transistors 700/900 may be any of the enhanced passgate structures that have been described in the foregoing.

Also shown in FIG. 10 is a higher than nominal voltage source, $V_{CCX}$, which is coupled to memory cells 1010. As discussed above, the higher than nominal voltage may be supplied by a separate I/O pin that provides a supply voltage higher than the nominal supply voltage, generated from a charge pump, a voltage leveler, or the like.

An advantage realized by powering memory cells 1010 with a higher than nominal voltage is that it reduces the potential for soft-error. Soft-error occurs when the logic state being stored in the memory cell inadvertently changes. Soft-error can be caused by, for example, sub-atomic particles (sometimes referred to as alpha particles or neutron beams) that disrupt the operation of silicon by changing the charge of the memory cell. Soft-error can also be caused by cross-coupling of memory cells. As supply voltages (e.g., nominal voltages) continue to decrease, the soft-error-rate increases because the critical charge needed to flip the cell decreases as the supply voltage decreases. Therefore, application of $V_{CCX}$, as opposed to a nominal voltage, provides a supply voltage that enables memory cells 1010 to operate with a relatively low soft-error-rate.

Thus, a synergy is created among memory cells 1010 and the passgate transistors 700/900 because $V_{CCX}$ provides voltage sufficient to minimize soft-error and is also sufficient to drive passgate transistors at a predetermined operational speed (i.e., $V_{CCX}$ is at least equal to the passgate activation voltage). That is, memory cells 1010 selectively drive passgate transistors 700/900 by applying the voltage provided by $V_{CCX}$ (e.g., a passgate activation voltage) to the gates of the passgate transistors 700/900. Thus, the advantage of powering memory cells 1010 with higher than nominal voltage prevents inadvertent flipping, while at the same time enables memory cells 1010 to drive passgates 700/900 with the requisite voltage.

Figure 11:
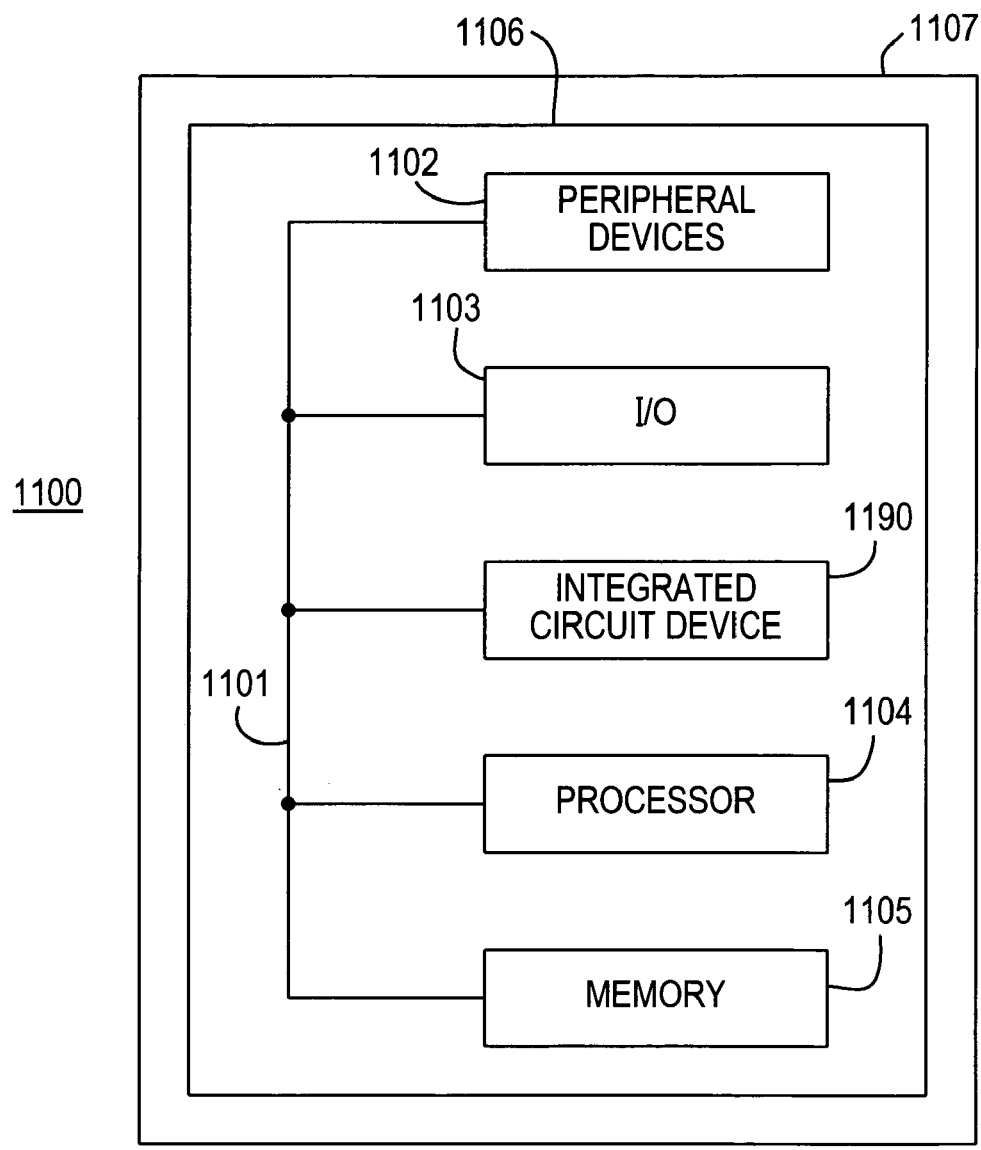
FIG. 11 is a simplified block diagram of an illustrative system that includes an integrated circuit device that has been improved in accordance with the principles of the present invention.

FIG. 11 shows how an integrated circuit device 1190 (e.g., a programmable logic device) employing any of the enhanced passgate structures that have been described in the foregoing may be used in a system 1100. System 1100 may include one or more of the following components: various peripheral devices 1102, I/O circuitry 1103, a processor 1104, and a memory 1105. These components may be coupled together by a system bus 1101 and may be populated on a circuit board 1106 which is contained in an end-user system 1107.

System 1100 can be used in a wide variety of applications, such as computer networking, data networking, instrumentation, video processing, digital signal processing, or any other application where the advantage of using programmable or reprogrammable logic is desirable. Integrated circuit device 90, employing passgate structures that have been constructed in accordance with the principles of the present invention, may be used to perform a variety of different logic functions. For example, integrated circuit device 1190 can be configured as a processor or controller that works in cooperation with processor 1104. Integrated circuit device 1190 may also be used as an arbiter for arbitrating access to a shared resource in system 1100. In yet another example, integrated circuit device 1190 may be configured as an interface between processor 1104 and one of the other components in system.

Various technologies may be used to implement the integrated circuit device 1190 employing pass-gate structures that have been constructed in accordance with the principles of the present invention. Moreover, this invention is applicable to both one-time-only programmable and reprogrammable devices.

Thus, it is seen that enhanced pass-gate structures for an integrated circuit device have been presented. One skilled in the art will appreciate that the present invention may be practiced by other than the described embodiments, which are presented for purposes of illustration and not of limitation, and the present invention is limited only by the claims which follow.

What is claimed is:
1. A programmable logic device, comprising:
an array of logic blocks comprising transistors each having a nominal threshold voltage, the transistors of the array of logic blocks being selectively activated with a nominal voltage;
a plurality of interconnect lines;
a plurality of switches for programmably routing logic signals between the logic blocks over the interconnect lines, wherein the switches include passgate transistors having threshold voltages that are higher than the nominal threshold voltage, and wherein the passgate transistors are selectively activated by a passgate acti- vation voltage applied to a gate terminal of each passgate transistor, the passgate activation voltage exceeding the nominal voltage; and a plurality of memory cells that are powered with a memory cell supply voltage that is equal to or greater than the passgate activation voltage, wherein at least one memory cell includes an output coupled to the gate terminal of a passgate transistor of said passgate transistors.

2. The programmable logic device defined in claim 1, wherein the memory cells selectively provide the pass-gate activation voltage to the passgate transistors.

3. The programmable logic device defined in claim 1, wherein the memory cells are SRAM cells.

4. The programmable logic device defined in claim 1, wherein the memory cell supply voltage is provided by a level-shifter, a charge pump, a reference voltage generator, a voltage divider circuit, or an input/output pin on the programmable logic device wherein the input/output pin receives the memory cell supply voltage from a power source located external to the programmable logic device.

5. The programmable logic device defined in claim 1, wherein at least one of the passgate transistors is fabricated to have a threshold voltage that is higher than the nominal threshold voltage.

6. The programmable logic device defined in claim 1, wherein at least one of the passgate transistors is a semiconductor transistor fabricated within a well region and having a connection for biasing the well region with respect to other regions of the semiconductor to increase the threshold voltage of the passgate transistor to a value higher than the first threshold voltage.

7. The programmable logic device defined in claim 1, wherein the passgate transistors are NMOS transistors.

8. A digital processing system comprising:
processing circuitry; and
the programmable logic device defined in claim 1 coupled to the processing circuitry.

9. A printed circuit board on which is mounted the programmable logic device defined in claim 1.

10. An integrated circuit, comprising:
an array of logic blocks comprising a set of transistors having a nominal threshold voltage, each transistor of said set being selectively activated with a nominal voltage applied to its gate terminal; and
a set of passgate transistors for routing logic signals between said logic blocks and having a passgate threshold voltage that is higher than the nominal threshold voltage by a predetermined percentage, each passgate transistor being selectively activated with a passgate activation voltage that exceeds the nominal voltage, the passgate activation voltage being applied to the gate terminal of each passgate transistor by a memory cell.

11. The integrated circuit defined in claim 10, wherein said predetermined percentage ranges from about one percent to about two hundred percent.

12. The integrated circuit defined in claim 10, wherein said predetermined percentage ranges from about five percent to about forty percent.

13. The integrated circuit defined in claim 10, wherein said predetermined percentage ranges from about ten percent to about thirty-five percent.

14. The integrated circuit defined in claim 10, wherein said predetermined percentage ranges from about fifteen percent to about thirty percent.

15. The integrated circuit defined in claim 10, wherein said nominal voltage is a supply voltage provided to the integrated circuit.

16. The integrated circuit defined in claim 10, wherein said memory cell is powered by a memory cell supply voltage that is equal to or greater than the passgate activation voltage.

17. The integrated circuit defined in claim 10, wherein the memory cell is an SRAM cell.

18. The integrated circuitry defined in claim 10, wherein said passgate transistors are NMOS transistors.

19. A digital processing system comprising:
processing circuitry; and
the integrated circuit defined in claim 10 coupled to the processing circuitry and the system memory.

20. A printed circuit board on which is mounted the integrated circuit defined in claim 10.

21. The printed circuit board defined in claim 20 further comprising:
a board memory mounted on the printed circuit board and coupled to the integrated circuit device.

22. The printed circuit board defined in claim 21 further comprising:
processing circuitry mounted on the printed circuit board and coupled to the integrated circuit device.

23. A programmable logic device including at least one transistor having a nominal threshold voltage, the programmable logic device comprising:
a high voltage power source that provides a voltage higher than a low voltage being supplied to the at least one transistor;
a configurable memory cell that is coupled to the high voltage power source;
a passgate transistor having a gate, input, and output terminals, the gate terminal being coupled to the configurable memory cell, the pass-gate transistor having a threshold voltage that is higher than the nominal threshold voltage, and the pass-gate transistor being selectively activated by the application of the high voltage to the gate terminal.

24. The programmable logic device of claim 23, wherein the configurable memory cell is an SRAM cell.

* * * * *